United States Patent
Kim

(10) Patent No.: US 6,583,004 B2
(45) Date of Patent: Jun. 24, 2003

(54) SEMICONDUCTOR MEMORY DEVICE AND METHOD FOR MANUFACTURING THE SAME

(75) Inventor: Jeong-Seok Kim, Kyungki-do (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/104,363

(22) Filed: Mar. 21, 2002

(65) Prior Publication Data

US 2002/0102790 A1 Aug. 1, 2002

Related U.S. Application Data

(62) Division of application No. 09/916,736, filed on Jul. 26, 2001.

(30) Foreign Application Priority Data

Sep. 18, 2000 (KR) .............................. 00-54625

(51) Int. Cl.⁷ .................. H01L 21/8242; H01L 21/338; H01L 21/8236
(52) U.S. Cl. ................ 438/241; 438/183; 438/276
(58) Field of Search ................. 438/238–239, 438/241, 243, 253–256, 396–399, 183–185, 276, 289–290, 307; 257/295–211, 324–326

(56) References Cited

U.S. PATENT DOCUMENTS

| | | | | |
|---|---|---|---|---|
| 5,434,093 A | * | 7/1995 | Chau et al. | 438/300 |
| 5,541,427 A | * | 7/1996 | Chappell et al. | 257/306 |
| 5,858,831 A | * | 1/1999 | Sung | 438/241 |
| 5,904,530 A | | 5/1999 | Shin | 438/291 |
| 6,087,208 A | * | 7/2000 | Krivokapic et al. | 438/183 |
| 6,200,850 B1 | * | 3/2001 | Wu | 438/241 |
| 6,214,677 B1 | * | 4/2001 | Lee | 438/284 |

OTHER PUBLICATIONS

D.W. Ha, Self Aligned Local Implantation Using Reverse Gate Pattern for Deep Submicron Dram Cell Tansistors Jpn. J. Appl. Phys. vol. 37(1998) pp. 1059.

* cited by examiner

*Primary Examiner*—Shouxiang Hu
(74) *Attorney, Agent, or Firm*—Marger Johnson & McCollom

(57) ABSTRACT

A technology of preventing the threshold voltage of the transistor of a cell region from increasing and the refresh characteristic of the transistor of the cell region from deteriorating, while maintaining the characteristic of the transistor of core circuit/peripheral circuit regions of a semiconductor memory device, is provided. A semiconductor memory device comprises a first transistor comprised of a first gate, a first gate insulating film, a first source region, and a first drain region formed in core circuit/peripheral circuit regions of a semiconductor memory device having a cell region and core circuit/peripheral circuit regions, a planarized interlayer dielectric film which covers the first transistor, and a second transistor formed in the cell region, including a second source region, a second drain region, a second gate having a height corresponding to the height of the interlayer dielectric film, and a second gate insulating film. The first transistor is formed using conventional manufacturing processes, the second transistor is formed by a damascene method, using the interlayer dielectric film as the basis of a reverse gate pattern.

21 Claims, 10 Drawing Sheets

SEMICONDUCTOR MEMORY DEVICE AND METHOD FOR MANUFACTURING THE SAME

Figure 1:
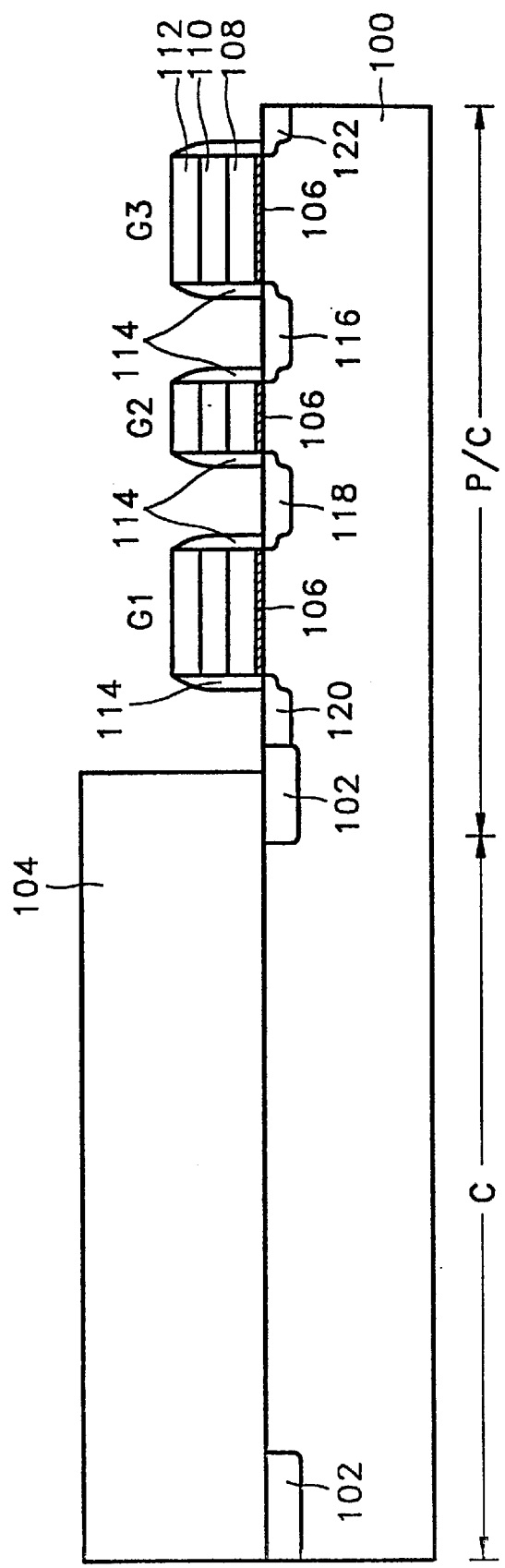

This application is a divisional of U.S. patent application Ser. No. 09/916,736, filed Jul. 26, 2001, now pending, which is herein incorporated by reference in its entirety.

BACKGROUND OF THE INVENTION

1. Field of the Invention

The present invention relates to a semiconductor memory device and a method for manufacturing the same, and more particularly, to a semiconductor memory device in which the characteristics of a plurality of unit elements having different geometrical structures, for example, transistors, are not deteriorated.

2. Description of the Related Art

As the integration density of semiconductor memory devices increases, the sizes of unit elements becomes smaller. In particular, as the size of a cell transistor is reduced, a short channel phenomenon occurs, in which a threshold voltage is reduced and leakage current increases. Accordingly, the dynamic refresh characteristics of a dynamic random access memory (DRAM) are deteriorated. In order to solve such problems, the concentration of impurities of a substrate is increased by implanting P-type (or N-type) impurity ions into the substrate before forming a gate electrode in an N-channel transistor (or a P-channel transistor) for increasing the threshold voltage.

Also, in order to form N-type (P-type) source and drain regions in the case of an N-channel transistor (or a P-channel transistor), the concentration of the impurities of the source and drain regions must be greater than the concentration of the channel region. As the size of the transistor is reduced, the concentration of impurities implanted by ion implantation for suppressing change in the threshold voltage must increase. Therefore, the difference between the concentration of the impurities of the source and drain regions of the transistor and the concentration of the impurities of the channel region is reduced as the integration density increases. Therefore, the resistance in a contact surface between the source and drain regions and the channel region increases. Accordingly, the operation speed of the transistor is reduced.

Furthermore, since the concentration of impurity ions for controlling the threshold voltage of the substrate (or a well formed in the substrate) increases as the integration density increases, leakage current that can flow from the source and drain regions to the substrate (or the well) increases. In order to solve such problems, an ion implantation technology by which an impurity region is partially formed only under the channel region of the transistor and, not in the entire substrate in which the transistor is to be formed, using a reverse gate pattern, is disclosed in the U.S. Pat. No. 5,904,530 and Japanese Journal of Applied Physics; 1998, 1059.

It is most preferable to simultaneously form the transistors of the cell region of a semiconductor memory device and the transistors of a core circuit/peripheral circuit regions using the method disclosed in the above-mentioned publications in order to simplify manufacturing processes. Since all the transistors of the cell region constitute a part of a memory device, the lengths of all gates are equal. However, the transistors of the core circuit/peripheral circuit regions are designed to have different lengths depending on the purposes of the respective transistors, in which some transistors are used to constitute differential amplifiers and other transistors are used to constitute drivers. At this time, even though the thickness of a conductive material deposited for forming a gate is the same in the cell region and the core circuit/peripheral circuit regions, since it is determined whether or not to fill a trench depending on the width of the trench provided in an insulating layer or the thickness of the deposited material, the height of the gate differs in each region in a successive etch back process. It is possible to perform the etch back process in the core circuit/peripheral circuit regions separately from the etch back process in the cell region, in order to manufacture the gates of the core circuit/peripheral circuit regions as designed. Since the lengths of the gates of the transistors of the core circuit/peripheral circuit regions vary, although an etch back time is controlled in order to manufacture some gates as designed, the other gates are not manufactured as desired. It is possible to obtain the gates of the cell region and the core circuit/peripheral circuit regions as designed by performing etch back processes corresponding to the respective lengths of the gates of the core circuit/peripheral circuit regions. However, in this case, processes become complicated.

SUMMARY OF THE INVENTION

It is an object of the present invention to provide a semiconductor memory device having elements whose geometrical structures are different from each other, in which it is possible to maintain the characteristics of elements, for example, transistors formed in some regions, whose geometrical structures are different from other elements formed in other regions without deterioration of the characteristics of the other elements in other regions, and a method for manufacturing the same.

Accordingly, to achieve the above object, according to an aspect of the present invention, there is provided a first transistor comprised of a first gate, a first gate insulating film, a first source region, and a first drain region formed in a semiconductor substrate in core circuit/peripheral circuit regions of a semiconductor memory device having a cell region comprised of elements having a uniform standard, for example, a transistor (a second transistor) and the core circuit/peripheral circuit regions comprised of elements having various standards, for example, a transistor (a first transistor), a planarized interlayer dielectric film which covers the first transistor, and a second transistor formed in the cell region, comprising a second source region, a second drain region, a second gate having a height corresponding to the height of the interlayer dielectric film, and a second gate insulating film.

The second gate can be formed to be level with the interlayer dielectric film. When the height of the interlayer dielectric film increases, the height of the second gate also increases.

The first transistor further comprises a first spacer formed on the side wall of the first gate, the second gate of the second transistor is in the form of a convex lens, and the second transistor further comprises a second spacer formed on the side wall of the second gate. The second spacer is a first insulating film formed of a material having a high etch selectivity with respect to the interlayer dielectric film under a predetermined etchant. The interlayer dielectric film is a silicon nitride film, a silicon oxide film, a phosphosilicate glass (PSG) film, a borosilicate glass (BSG) film, a borophosphosilicate glass (BPSG) film, a tetraethylorthosilicate glass (TEOS) film, an ozone-TEOS film, an undopedsilicate glass (USG) film, or a combination of the above films and the first insulating film is the silicon nitride film, an aluminum oxide film, or a tantalum oxide film.

The second gate is formed of a polysilicon layer and a refractory metal layer and further comprises a second insulating film formed of a material having high etch selectivity with respect to the interlayer dielectric film formed on the refractory metal layer under a predetermined etchant. The second gate is formed of a polysilicon layer and a refractory metal layer and further comprises a second insulating film formed of a material having high etch selectivity with respect to the interlayer dielectric film formed on the refractory metal layer under a predetermined etchant.

The refractory metal layer is Co, W, Ta, Mo, or Ti. The refractory metal silicide layer is $CoSi_x$, $TiSi_x$, $TaSi_x$, $MoSi_x$, $WSi_x$, or $PtSi_x$. The second insulating film is the silicon nitride film, an aluminum oxide film, or a tantalum oxide film.

The first transistor further comprises a third insulating film formed on the top of the first gate and the second insulating film is thicker than the third insulating film. The thickness of the third insulating film is between 1500 and 2500A.

In order to protect the semiconductor substrate and the first transistor, the semiconductor memory device further comprises a fourth insulating film, which is formed on the overall surface of the semiconductor substrate that belongs to the core circuit/peripheral circuit regions, in which the first transistor is formed, and has a high etch selectivity with respect to the interlayer dielectric film under a predetermined etchant. The semiconductor memory device further comprises a buffer film formed between the fourth insulating film and the semiconductor substrate that belongs to the core circuit/peripheral circuit regions. The fourth insulating film is the silicon nitride film, an aluminum oxide film, or a tantalum oxide film.

In order to suppress the leakage current of the second gate, the thickness of the second gate insulating film is equal to or greater than the thickness of the first gate insulating film. The first gate insulating film preferably has a thickness of between 30 and 60A and the second gate insulating film preferably has a thickness of between 40 through 70A.

In order to improve the characteristic of the transistor of a cell region, the second transistor further comprises an ion implantation region, which is formed in the semiconductor substrate under a second gate and into which impurity ions of the same conductive type of the semiconductor substrate are implanted or an ion implantation region, which is formed in the semiconductor substrate corresponding to the second spacer and into which impurity ions of the same conductive type of the semiconductor substrate are implanted.

According to another aspect of the present invention, in order to manufacture the semiconductor memory device having the cell region comprised of the elements having the uniform standard, for example, the transistor (the second transistor) and the core circuit/peripheral circuit regions comprised of the elements having various standards, for example, the transistor (the first transistor), a first transistor is formed in the semiconductor substrate that belongs to the core circuit/peripheral circuit regions. A planarized interlayer dielectric film is formed on the overall surface of the semiconductor substrate of a highly integrated semiconductor memory device, in which the first transistor is formed. A second transistor is formed in the cell region by a damascene method, using the interlayer dielectric film positioned in the cell region as the basis of reverse gate patterns.

In order to form the second transistor, reverse gate patterns and a first trench positioned between the reverse gate patterns are preferably formed by patterning the interlayer dielectric film positioned on the cell region. An impurity region for controlling a threshold voltage is preferably formed by implanting impurity ions into the first trench. A gate is preferably formed on the impurity region for controlling the threshold voltage by filling the first trench with a conductive material. A second trench is preferably formed by etching the reverse gate patterns. Source and drain regions are preferably formed by implanting impurity ions using the gate as a mask.

More preferably, spacers formed of a material having a high etch selectivity with respect to the interlayer dielectric film is formed under a predetermined etchant on the outside walls of the reverse gate patterns between the step of forming the first trench and the step of forming the threshold voltage controlling impurity region.

The interlayer dielectric film is a silicon oxide film, a silicon nitride film, a PSG film, a BSG film, a BPSG film, a TEOS film, an ozone-TEOS film, a PE-TEOS film, a USG film, or a combination of the above films and the spacer is formed of a material different from the material that forms the interlayer dielectric film and is the silicon nitride film, an aluminum oxide film, or a tantalum oxide film.

In order to protect the semiconductor substrate and the first transistor, an etching stop layer is formed of a material having a high etch selectivity with respect to the interlayer dielectric film under a predetermined etchant on the semiconductor substrate of the cell region and the core circuit/peripheral circuit regions, between the step of forming the first transistor and the step of forming the interlayer dielectric film. The etching stop layer is formed of a material that forms the interlayer dielectric film and is the silicon nitride film, an aluminum oxide film, or a tantalum oxide film. A buffer film formed of the silicon oxide film or the silicon oxinitride film is formed on the semiconductor substrate of the cell region and the core circuit/peripheral circuit regions between the step of forming the first transistor and the step of forming the etching stop layer.

The step of forming the gate of the transistor of the cell region will now be described. The gate is completed by forming a polysilicon layer, with which the first trench is filled to a first height of the first trench, and a refractory metal layer, with which the trench is filled from the first height to a second height. An insulating film, with which the first trench is filled from the second height to the top of the first trench and which is formed of a material having a high etch selectivity with respect to the interlayer dielectric film under a predetermined etchant, is formed. Another method for forming the gate includes the steps of forming a polysilicon layer, with which the first trench is filled to a first height of the first trench and forming a first refractory metal layer, with which the trench is filled from the first height to a second height. The gate is completed by changing some of the first refractory metal layer into a refractory metal silicide layer by silicide reaction. An insulating film, with which the first trench is filled from the second height to the top of the first trench and which is formed of a material having a high etch selectivity with respect to the interlayer dielectric film under a predetermined etchant, is formed. Another method for forming a gate electrode includes the steps of forming a polysilicon layer, with which the first trench is filled to a first height, forming a first refractory metal layer, with which the trench is filled from the first height to a second height, and changing all of the first refractory metal layer into a refractory metal silicide layer by silicide reaction. After completing the gate, an insulating film, with which the first trench is filled from the second height to the top of the first trench and which is formed of a material having a high etch selectivity with respect to the interlayer dielectric film under a predetermined etchant, is formed.

The refractory metal layer is Co, W, Ta, Mo, or Ti. The refractory metal silicide layer is $CoSi_x$, $TiSi_x$, $TaSi_x$, $MoSi_x$, $WSi_x$, or $PtSi_x$. The insulating film is formed of a material different from the material that forms the interlayer dielectric film and is the silicon nitride film, an aluminum oxide film, or a tantalum oxide film.

BRIEF DESCRIPTION OF THE DRAWING(S)

The above object and advantages of the present invention will become more apparent by describing in detail a preferred embodiment thereof with reference to the attached drawings in which:

FIGS. 1 through 10 are sectional views showing processes of a method for manufacturing a semiconductor memory device according to the present invention.

DESCRIPTION OF THE PREFERRED EMBODIMENT

The present invention will now be described more fully with reference to the accompanying drawings. In FIG. 1, an isolation region 102 is formed in a semiconductor substrate 100 in which a cell region C and core circuit/peripheral circuit regions P/C are to be formed. A plurality of isolation regions can be formed in order to insulate separate elements in the cell region C. The plurality of isolation regions can be formed in the core circuit/peripheral circuit regions P/C. However, in order to keep the illustration in FIG. 1 simple, only the isolation region 102 for separating the cell region C from the core circuit/peripheral circuit regions P/C is shown. A method of forming the isolation region 102 will now be described in detail. After forming a trench (not shown) in the semiconductor substrate 100, an oxide film is formed on the side wall of the trench and the trench is filled with an oxide film. The silicon trench isolation (STI) isolation region 102 is formed by planarizing the semiconductor substrate 100 by performing chemical and mechanical polishing. The isolation region 102 can be formed by local oxidation of silicon (LOCOS). The isolation region is preferably formed by the STI method in a highly integrated semiconductor device.

An ion implantation process for forming an N well and/or a P well is performed in the cell region C and the core circuit/peripheral circuit regions P/C (not shown). A mask 104 for blocking the cell region C is formed. A common ion implantation process for controlling the threshold voltage of a transistor is performed on the entire semiconductor substrate of the core circuit/peripheral circuit regions P/C (not shown).

As shown in FIG. 1, a transistor is formed in the core circuit/peripheral circuit regions P/C. First, an oxide film 106 is formed to a thickness of between 30 and 60A as a gate insulating film. Gates G1, G2, and G3 are formed of a polysilicon layer pattern 108, a metal silicide layer pattern 110, and an insulating film pattern 112 by sequentially forming a polysilicon layer of between 500 and 1500A, a metal silicide layer of between 500 and 1500A, and an insulating film of between 1000 and 3000A on the gate oxide film 106 and patterning the polysilicon layer, the metal silicide layer, and the insulating layer. The metal silicide layer is formed of $CoSi_x$, $TiSi_x$, $TaSi_x$, $MoSi_x$, $WSi_x$, or $PtSi_x$. A silicon nitride film or a silicon nitride oxide film can be used as the insulating film. A refractory metal layer can be used instead of the metal silicide layer. The refractory metal layer can be formed of Co, W, Ta, Mo, or Ti. An impurity region is formed by performing the ion implantation process for forming source and drain regions having low density after forming the gate.

A spacer 114 is formed on the outside wall of the gates G1, G2, and G3 to a thickness of between 300 and 1000A by forming the silicon oxide film or the silicon nitride film on the entire surface of the core circuit/peripheral circuit regions P/C in which the gates G1, G2, and G3 are formed, and performing an etch back process. Source and drain regions 116, 118, 120, and 122 having a lightly doped drain and source (LDD) structure are formed by performing the ion implantation process for forming source and drain regions having a high concentration. The source and drain regions can have a double doped drain and source (DDD) structure.

Though not shown, then, the mask 104 formed on the cell region C is removed.

Figure 2:
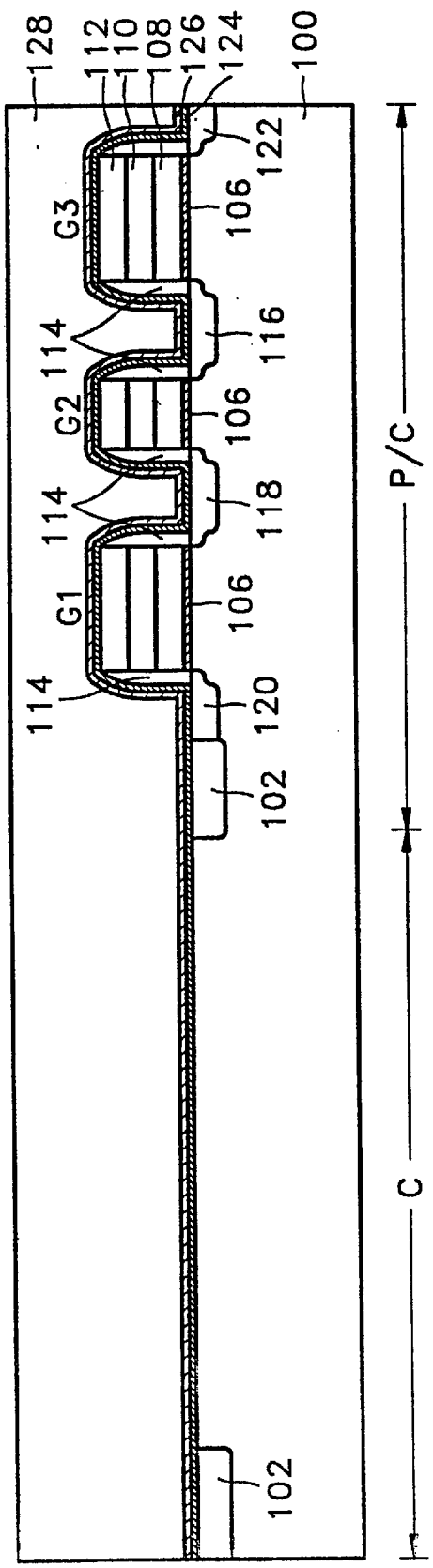

In FIG. 2, a buffer layer 124 of between 50 and 100A, an etching stop layer 126 of between 50 and 150A, and an interlayer dielectric film 128 of between 2200 and 6500A are sequentially formed on the entire surface of the cell region C and the core circuit/peripheral circuit regions P/C. The buffer layer 124, which is formed of the silicon oxide film or the silicon oxinitride film, strengthens the adhesion between the semiconductor substrate 100 and the etching stop layer 126. When the etch stopping layer 126 is formed of a material having a high etch selectivity with respect to the interlayer dielectric film under a predetermined etchant, the trench that exposes the source and drain regions 116, 118, 120, or 122 of the core circuit/peripheral circuit regions P/C can be formed in a self-alignment method. In order to perform the above-mentioned function, the etching stop layer 126 can be formed of the silicon nitride film, an aluminum oxide film, or a tantalum oxide film. The interlayer dielectric film is formed of a material different from the material that forms the etching stop layer 126. The interlayer dielectric film can be formed of a silicon oxide film, a silicon nitride film, a phosphosilicate glass (PSG) film, a borosilicate glass (BSG) film, a borophosphosilicate glass (BPSG) film, a tetraethylorthosilicate glass (TEOS) film, an ozone-TEOS film, a PE-TEOS film, or an undoped silicate glass (USG) film, or a combination of the above films. A planarized interlayer dielectric film 128 is formed by performing chemical and mechanical polishing on the interlayer dielectric film.

Figure 3:
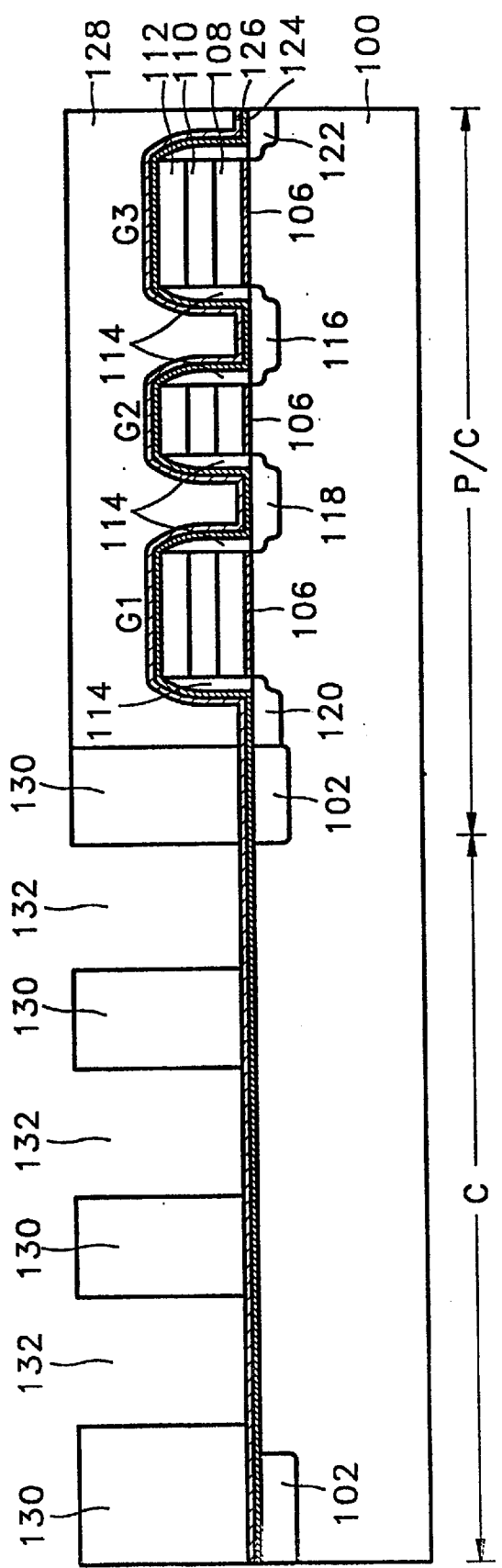

In FIGS. 3 through 8, transistors including a gate are formed in the cell region C using a damascene method. In FIG. 3, reverse gate patterns 130 and first trenches 132 arranged therebetween are formed by patterning and etching the interlayer dielectric film 128 in the cell region C until the etching stop layer 126 thereunder is exposed. The etching stop layer 126 prevents the semiconductor substrate 100 from being damaged when the first trenches 132 are formed in the cell region C and prevents the impurities generated when the interlayer dielectric film 128 is formed from permeating the gates G1, G2, and G3 in the core circuit/peripheral circuit regions P/C. The gates of the transistors of the cell region are formed in the first trenches 132. The height of the gate of the transistors of the cell region C is determined by the height of the reverse gate pattern 130, that is, the height of the interlayer dielectric film 128.

Figure 4:
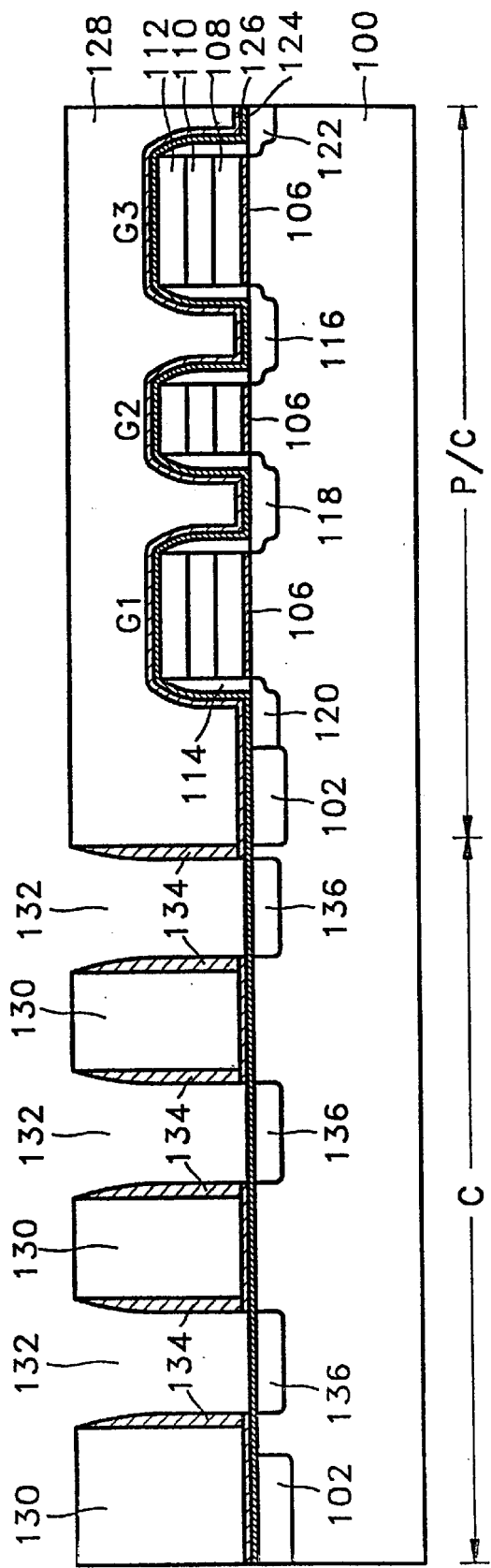

In FIG. 4, spacers 134 of between 200 through 700A are formed on the outside walls (or the inside walls of the first trenches 132) by performing the etch back process after coating an insulating film on the entire surface of the cell region C and the core circuit/peripheral circuit regions P/C.

The silicon nitride film in the first trenches 132 is removed when over-etching is performed during the etch back process. Impurity regions 136 are formed in the semiconductor substrate 100 between the spacers 134 by performing the ion implantation process for controlling the threshold voltage of the transistor of the cell region C. It is possible to perform a partial ion implantation process for controlling the threshold voltage after forming the reverse gate patterns 130 and the first trenches 132 without forming the spacers 134.

It is possible to further improve the transistor refresh characteristic of the cell region C more by performing the partial ion implantation process after forming the spacers 134 than in a case where the partial ion implantation process for controlling the threshold voltage is performed in a state where the spacers 134 do not exist.

When the spacer 134 is formed of an insulating material having high selectivity with respect to the interlayer dielectric film under a predetermined etchant, a trench, in which a bit line contact pad or a storage electrode contact pad is to be formed, can be formed in the self-align manner after forming the transistors of the cell region C. The material film having high etch selectivity with respect to the interlayer dielectric film is the same as a material film that forms the above-mentioned etching stop layer 126 such as the silicon nitride film, the aluminum oxide film, or the tantalum oxide film.

Figure 5:
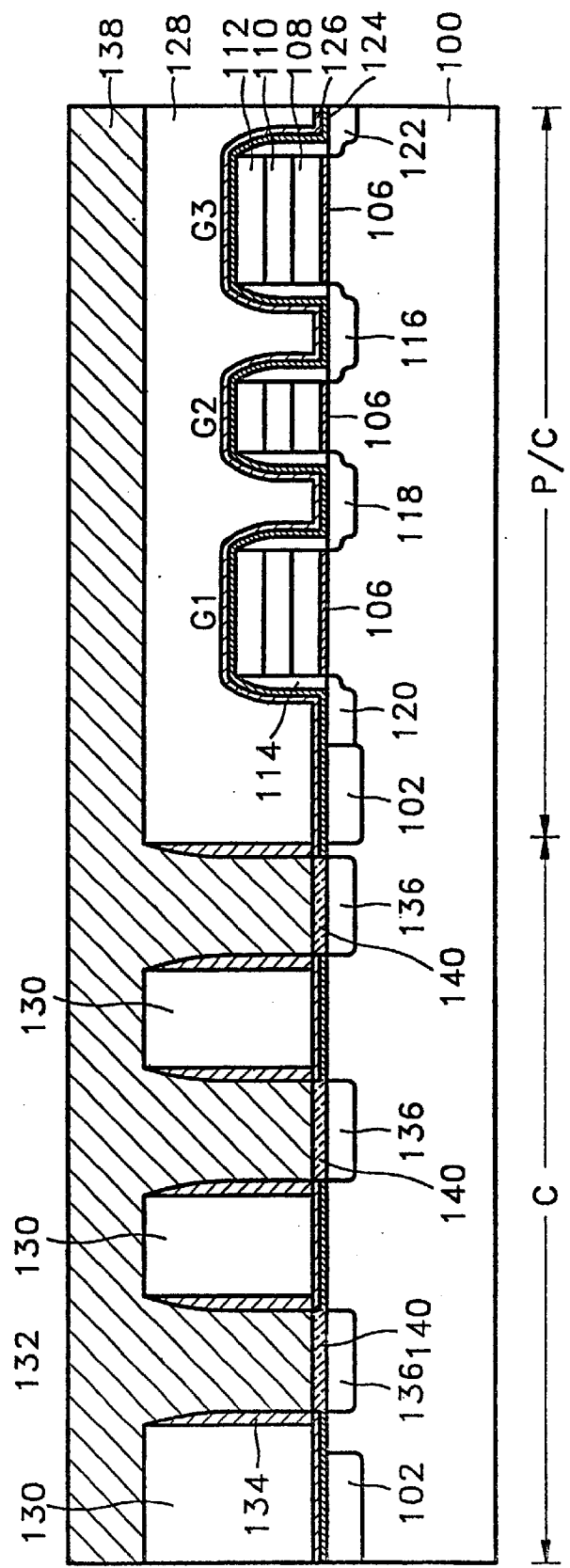

In FIG. 5, a gate oxide film 140 of the cell region C is grown after removing the buffer film 124 formed in the first trenches 132. Since the gate oxide film 140 of the cell region C is separately formed from the gate oxide film 106 of the transistor formed in the core circuit/peripheral circuit regions P/C, it is possible to grow the gate oxide film 140 to a thickness which is suitable for the characteristic of the transistor of the cell region C. In general, since the voltage applied to the gate of the transistor of the cell region C is twice as great as the voltage applied to the gate of the transistor of the core circuit/peripheral circuit regions P/C, the thickness of the gate oxide film 140 of the transistor of the cell region C is preferably larger than the thickness of the gate oxide film 106 of the core circuit/peripheral circuit regions P/C. In general, while the thickness of the gate oxide film 106 of the transistor of the core circuit/peripheral circuit regions P/C is between 30 and 60A, the thickness of the gate oxide film 140 of the transistor of the cell region C can be formed to a thickness between 40 and 70A.

The first trenches 132 are filled with an N+ doped polysilicon layer 138, which is formed on the entire surface of the cell region C and the core circuit/peripheral circuit regions P/C.

Figure 6:
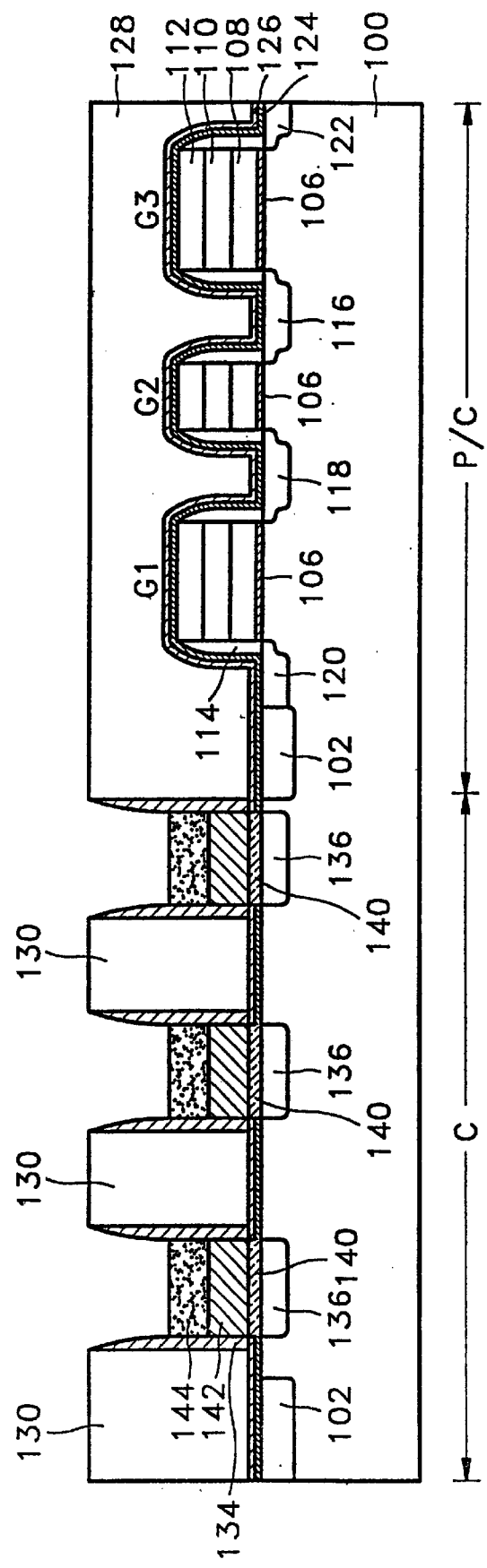

As shown in FIG. 6, a polysilicon layer pattern 142 is formed to a thickness of between 500 and 3000A from the bottom of the first trench 132 by chemical and mechanical polishing and etching back the N+ doped polysilicon layer 138. When the N+ doped polysilicon layer 138 is formed to partially fill the trench 132, it is possible to use only etch back process.

A refractory metal is formed on the polysilicon layer pattern 142 using a sputtering or chemical vapor deposition (CVD) method. A refractory metal silicide pattern 144 is formed to a thickness between 300 and 800A by performing a thermal process of the refractory metal. Depending on the thermal process conditions, all or some of the refractory metal layer may be changed into the metal silicide pattern. In the present embodiment, all of the refractory metal layer is changed into the metal silicide pattern. The refractory metal left after a silicide reaction is selectively removed using chemicals such as sulphuric acid and $H_2O_2$. Alternatively, it is possible to form a refractory metal layer (not shown) to a thickness of between 500 and 2000A on the entire surface of the cell region C using the CVD method instead of the metal silicide layer 144.

The metal composing the refractory metal layer can be made of Co, W, Ta, Mo, or Ti.

The refractory metal silicide pattern 144 can be made of $CoSi_x$, $TiSi_x$, $TaSi_x$, $MoSi_x$, $WSi_x$, or $PtSi_x$.

The refractory metal layer is etched back. Accordingly, a refractory metal layer pattern (not shown) is formed to a thickness between 300 and 700A. When the refractory metal layer is formed to completely fill the first trenches, the etch back process can be performed together with the chemical and mechanical polishing.

Figure 7:
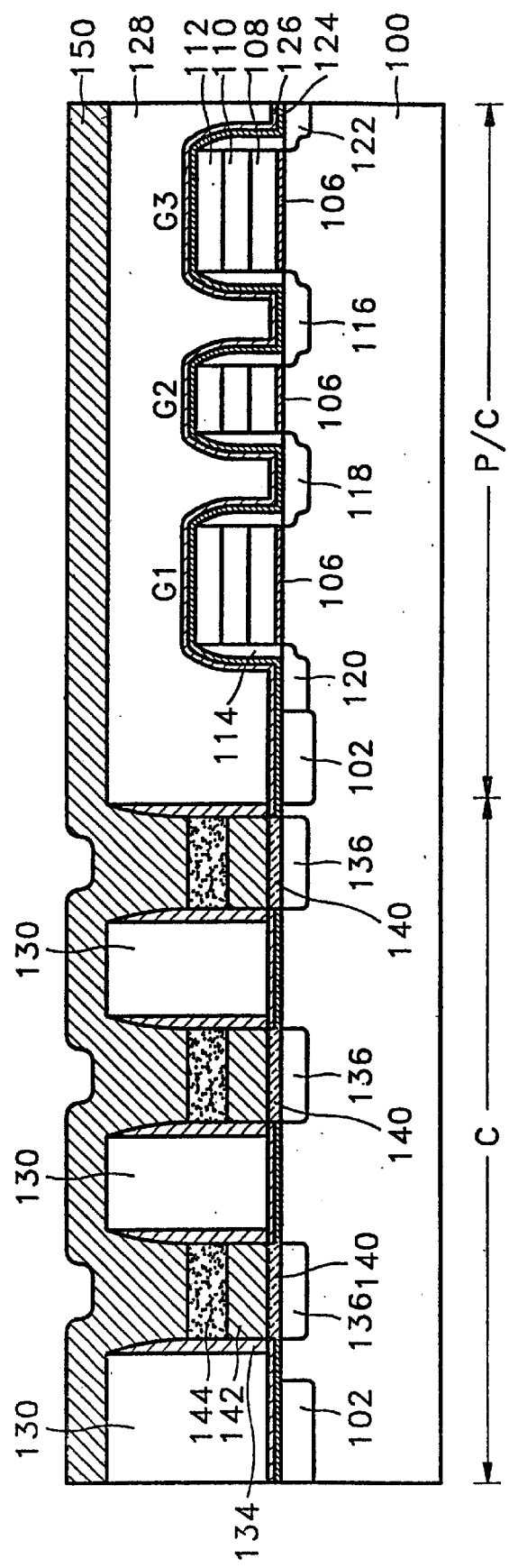

In FIG. 7, an insulating film 150 having a high etch selectivity with respect to the inerlayer dielectric film 128 under a predetermined etchant is formed on the entire surface of the resultant structure in which the metal silicide pattern 144 or the refractory metal layer pattern is formed, using the CVD method. The insulating film 150 is formed of a material that is different from the material that forms the interlayer dielectric film 128. The insulating film 150 is made of a silicon nitride film, an aluminum oxide film, or a tantalum oxide film.

Figure 8:
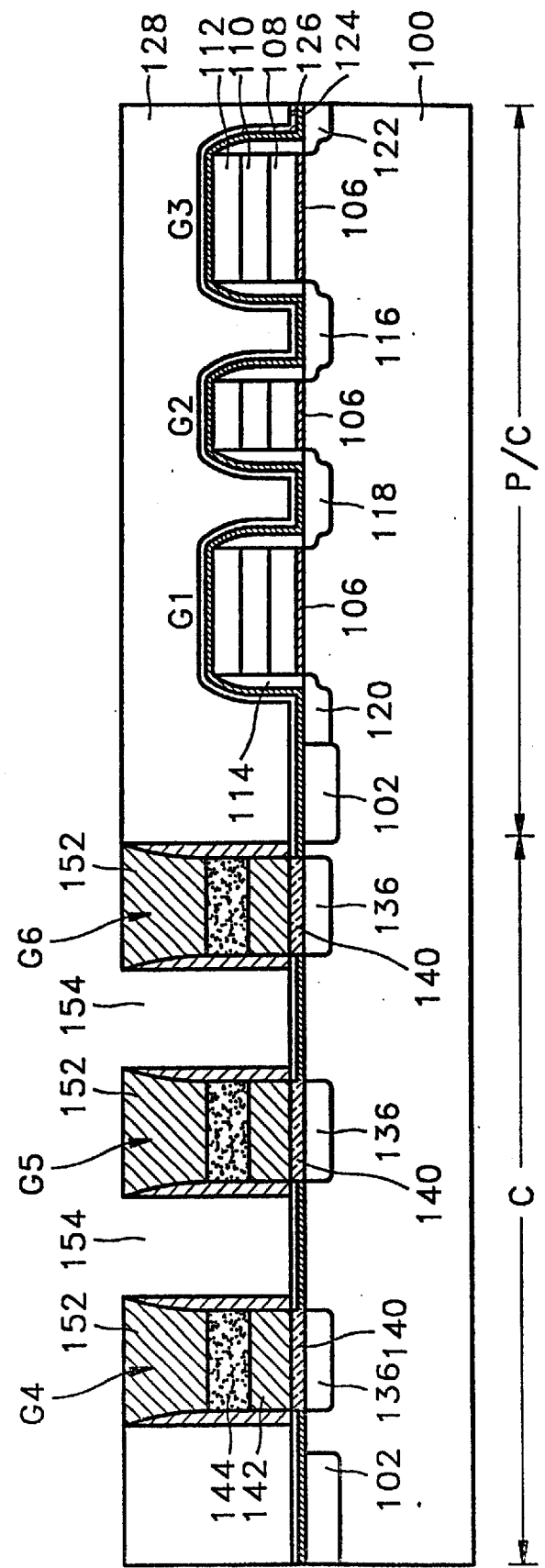

In FIG. 8, insulating film patterns 152 are formed to a thickness of between 1500 and 2500A by etching back or chemically and mechanically polishing the insulating film 150. Therefore, gates G4, G5, and G6 of the cell region, which are formed of the doped polysilicon layer patterns 142, the refractory silicide layer patterns 144, and the insulating film patterns 152 in the form of a convex lens, are manufactured. It is possible to form a gate including a refractory metal layer (not shown) instead of the refractory suicide layer pattern 144. The above-mentioned spacers 134 are formed on the side walls of the gates of the cell region.

In a conventional technology, after forming the gates of the cell region C, the gates are covered with an interlayer dielectric film. Therefore, as integration density increases, it is difficult to fill the spaces between the gates with the interlayer dielectric film without the formation of voids due to the increase in the aspect ratio of the gate. However, in the present invention, the gates G4, G5, and G6 of the cell region C are formed by patterning the interlayer dielectric film 128 that belongs to the cell region C to form reverse gate patterns, and filling spaces between the reverse gate patterns with the material of which the gate is to be formed. Here, in order to increase the height of the gate, after forming the transistor of the core circuit/peripheral circuit regions P/C, the interlayer dielectric film 128 formed on the entire surface of the semiconductor substrate 100 is formed to be thick. Therefore, it is not necessary to fill the spaces between the gates with the interlayer dielectric film.

The reverse gate pattern (130 of FIG. 7) is etched until the etching stop layer 126 formed on the semiconductor substrate 100 is exposed using a photolithography process. Since the insulating film patterns 152 and the spacer 134 of the gates G4, G5, and G6 are formed of a material having a high etch selectivity with respect to the material that forms the reverse gate pattern (130 of FIG. 7) under a predetermined etchant, it is possible to form second trenches 154 in the self-align manner.

Figure 9:
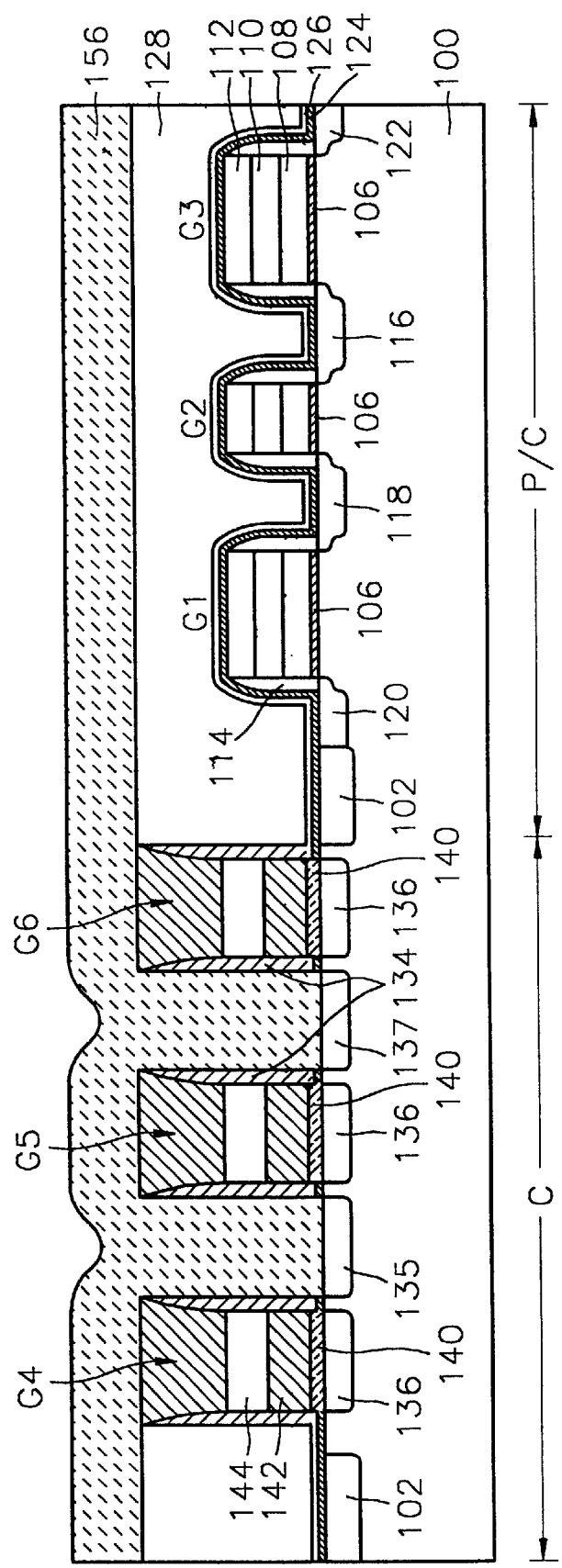

In FIG. 9, after removing the etching stop layer 126 located at the bottom of the second trenches 154 and the buffer film 124 under the etching stop layer 126, the substrate is subjected to cleaning. Source and drain regions 135 and 137 of the transistor are formed by performing an ion implantation process using the gates G4, G5, and G6 and the spacers 134 as masks after forming the second trenches 154. Due to the spacers 134 formed on the side walls of the gates G4, G5, and G6, the source and drain regions 135 and 137 are formed to be separate from the threshold voltage controlling impurity regions 136. When the spacers 134 are not formed, contact surfaces are formed between the threshold voltage controlling impurity regions 136 and the source and drain regions 135 and 137.

A polysilicon layer 156 is formed on the entire surface of the semiconductor substrate 100 so as to fill the second trenches.

Figure 10:
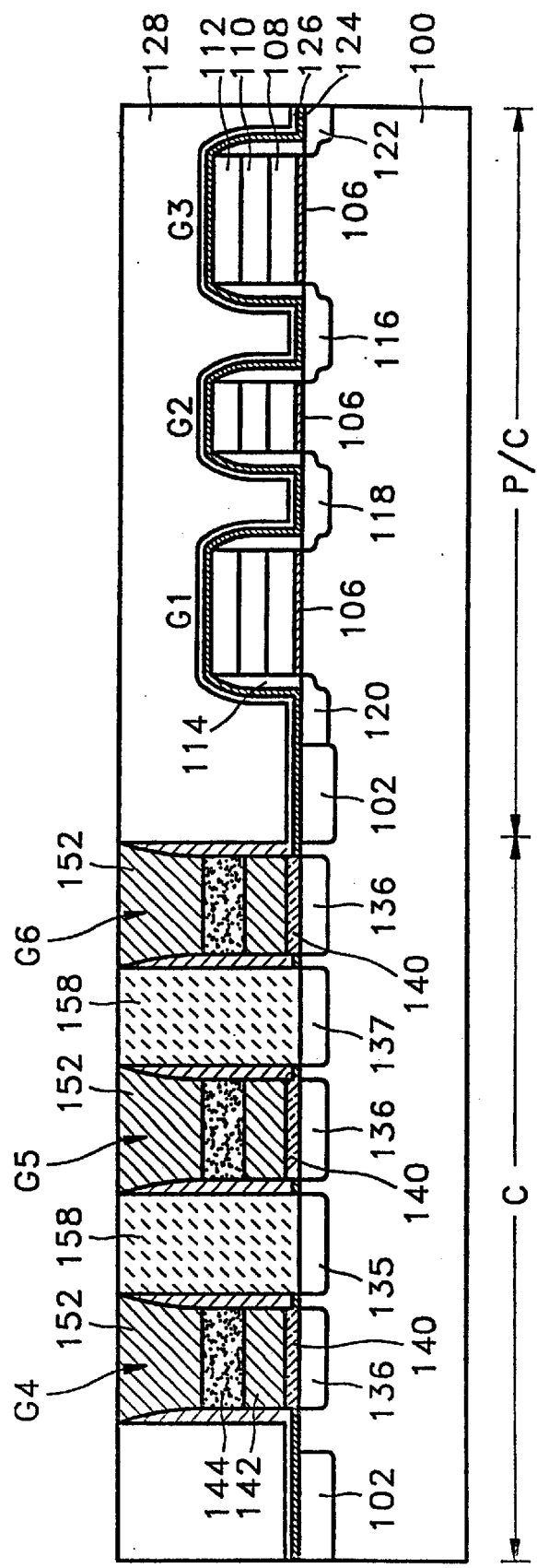

In FIG. 10, contact pads 158 are formed by chemically and mechanically polishing the polysilicon layer (156 of FIG. 9) until the insulating film patterns 152 of the gates G4, G5, and G6 are exposed. Some of the contact pads 158 are directly connected to a bit line (not shown) and the others are connected to the storage electrode (not shown) of the capacitor formed on the bit line (not shown).

Thereafter processes of forming an interlayer dielectric film, forming a plug for connecting a bit line, forming a bit line, forming an interlayer dielectric film, forming a plug for connecting a capacitor storage electrode, and forming a capacitor, which are used in conventional semiconductor memory device manufacturing processes, are performed.

The present invention was described with respect to the semiconductor memory device having a capacitor over bit line (COB) structure, however, it can be applied to a semiconductor memory device having a capacitor under bit line (CUB) structure. Namely, after forming the bit line of the semiconductor substrates of the cell region C and the core circuit/peripheral circuit regions P/C, transistors are formed in the semiconductor substrate of the core circuit/peripheral circuit regions P/C by a conventional method. An interlayer dielectric film is formed on the entire semiconductor substrate including the resultant, that is, on the entire surface of the substrate of the core circuit/peripheral circuit regions P/C.

Reverse gate patterns are formed by patterning the interlayer dielectric film belong to the cell region C. The transistor formed in the cell region is manufactured by forming a gate by filling trenches between the reverse gate patterns with a conductive material, removing the reverse gate patterns, and forming source and drain regions.

The partial ion implantation process for increasing the threshold voltage and securing the refresh characteristic of the semiconductor memory device and a contact hole self-alignment etching process for connecting the bit line to the substrate and the substrate to the capacitor can be applied to the semiconductor memory device of the CUB structure.

The advantages of the present invention, which were described above, will now be summarized.

First, elements such as the transistors of the core circuit/peripheral circuit regions P/C, which have various specifications, are formed using a common method that is used in a conventional technology. The interlayer dielectric film is formed on the entire surface of the substrate including the transistor devices of the core circuit/peripheral circuit regions P/C, which have various specifications. Then, transistor devices, which have uniform specifications and for which a fine control is required for maintaining the characteristics thereof, are formed using a damascene method on the basis of the reverse gate patterns. Therefore, it is possible to manufacture the transistor devices formed in all regions with their characteristics when designed maintained at the highest degree.

Second, since the height of the transistor element of the cell region is determined depending on the height of the previously existing interlayer dielectric film, it is not necessary to fill the spaces between the gates of the transistor with the insulating material after forming the transistor, which is required in the conventional technology.

Third, it is possible to form the insulating film (152 of FIG. 10) positioned on the top of the gates of the transistor, which have a uniform specification, to be thick in order to perform a self-alignment contact process by increasing the thickness of the interlayer dielectric film. Therefore, it is possible to increase an alignment process margin when the trenches 154 are formed later.

Fourth, it is possible to increase the threshold voltage of the transistor of the cell region and to improve the refresh characteristics by forming spacers on the side walls of the gates in the form of a convex lens of the transistor of the cell region, thus forming the impurity region for controlling the threshold voltage to be separate from the source and drain regions in the channel regions.

Fifth, since it is possible to separately grow the gate oxide film of the transistor of the cell region regardless of the formation of the gate oxide film of the core circuit/peripheral circuit regions P/C, the gate oxide film of the transistor of the cell region can be thicker than the gate oxide film of the core circuit/peripheral circuit regions P/C. Therefore, it is obtained to reduce leakage current which is generated as the gate oxide film becomes thinner.

What is claimed is:

1. A method for manufacturing a semiconductor memory device, comprising the steps of:
   forming a semiconductor substrate having a memory cell region and at least one core circuit/peripheral circuit region;
   forming a first transistor in the at least one core circuit/peripheral circuit region, wherein said first transistor includes a first gate stack having straight side walls and disposed between a first pair of spacers;
   forming an etch stop layer covering the semiconductor substrate, wherein said etch stop layer also covers the first gate stack;
   forming a planarized interlayer dielectric film covering the etch stop layer; and
   forming a second transistor in the memory cell region by a damascene method, wherein said second transistor has a second gate stack having concave-shaped side walls and disposed between a second pair of spacers, and said step of forming the second transistor further comprises the steps of:
      forming at least a pair of reverse gate patterns by patterning the interlayer dielectric film covering the memory cell region, so as to form a first trench positioned between the pair of reverse gate patterns;
      forming said second pair of spacers on inner sidewalls of said pair of reverse gate patterns, said second pair of spacers overlying a portion of the etch stop layer;
      implanting impurities into the semiconductor substrate through said first trench, so as to control a threshold voltage of the second transistor
      forming said second gate stack between said second pair of spacers in said first trench; and
      removing the pair of reverse gate patterns, so as to form a pair of second trenches with the second gate stack therebetween.

2. The method of claim 1, wherein a gate insulating layer in said second transistor is thicker than a gate insulating layer in the first transistor.

3. The method of claim 1, wherein the etching stop layer is formed of a material having a high etch selectivity with respect to the interlayer dielectric film when exposed to a predetermined etchant.

4. The method of claim 3, wherein the interlayer dielectric film is one selected from the group consisting of a silicon oxide film, a silicon nitride film, a PSG film, a BSG film, a BPSG film, a TEOS film, an ozone-TEOS film, a PE-TEOS film, a USG film, and a combination of the above films; and
the etching stop layer is formed of a material different from the material that forms the interlayer dielectric film and is one selected from the group consisting of a silicon nitride film, an aluminum oxide film, and a tantalum oxide film.

5. The method of claim 3, further comprising:
between the step of forming the first transistor and the step of forming the etching stop layer,
forming a buffer film on the semiconductor substrate on the cell region and the at least one core circuit/peripheral circuit region.

6. The method of claim 5, wherein the buffer film is a silicon oxide film or a silicon oxinitride film.

7. The method of claim 1, wherein the step of forming the second transistor further comprises the steps of:
forming source and drain regions for the second transistor by implanting impurity ions into the semiconductor substrate through the pair of second trenches.

8. The method of claim 7, wherein the step of implanting impurities into the semiconductor substrate through said first trench is performed either before or after the formation of the second pair of spacers.

9. The method of claim 8, wherein the second pair of spacers is formed of a material having a high etch selectivity with respect to the interlayer dielectric film when exposed to a predetermined etchant.

10. The method of claim 9, wherein the interlayer dielectric film is one selected from the group consisting of a silicon oxide film, a silicon nitride film, a PSG film, a BSG film, a BPSG film, a TEOS film, an ozone-TEOS film, a PE-TEOS film, a USG film, and a combination of the above films; and
the second pair of spacers is formed of a material different from the material that forms the interlayer dielectric film and is one selected from the group consisting of a silicon nitride film, an aluminum oxide film, and a tantalum oxide film.

11. The method of claim 9, wherein the etching stop layer is formed of a material having a high etch selectivity with respect to the interlayer dielectric film when exposed to a predetermined etchant.

12. The method of claim 11, wherein the interlayer dielectric film is one selected from the group consisting of a silicon oxide film, a silicon nitride film, a PSG film, a BSG film, a BPSG film, a TEOS film, an ozone-TEOS film, a PE-TEOS film, a USG film, and a combination of the above films, and the etching stop layer is formed of a material different from the material that forms the interlayer dielectric film and is one selected from the group consisting of a silicon nitride film, an aluminum oxide film, and a tantalum oxide film.

13. The method of claim 9, further comprising a step of forming contact pads by filling the pair of second trenches with polysilicon after the step of forming the source and drain regions.

14. The method of claim 13, wherein the step of forming the contact pads further comprises the steps of:
forming a polysilicon layer on the overall surface of the semiconductor substrate that belongs to the cell region; and
etching the polysilicon layer until the upper surface of the second gate stack is exposed.

15. The method of claim 7, wherein the etching stop layer is formed of a material having a high etch selectivity with respect to the interlayer dielectric film under a predetermined etchant.

16. The method of claim 7, wherein the step of forming the second gate stack further comprises the steps of:
forming a polysilicon layer, with which the first trench is filled to a first height;
forming a refractory metal layer, with which the first trench is filled from the first height to a second height, and;
further comprising the step of forming an insulating film, with which the first trench is filled from the second height to the top of the first trench and which is formed of a material having a high etch selectivity with respect to the interlayer dielectric film when exposed to a predetermined etchant.

17. The method of claim 16, wherein the refractory metal layer is one selected from the group consisting of Co, W, Ta, Mo, and Ti, the interlayer dielectric film is one selected from the group consisting of a silicon oxide film, a silicon nitride film, a PSG film, a BSG film, a BPSG film, a TEOS film, an ozone-TEOS film, a PE-TEOS film, a USG film, and a combination of the above films, and the insulating film is formed of a material different from the material that forms the interlayer dielectric film and is one selected from the group consisting of a silicon nitride film, an aluminum oxide film, and a tantalum oxide film.

18. The method of claim 7, wherein the step of forming the second gate stack further comprises the steps of:
forming a polysilicon layer, with which the first trench is filled to a first height;
forming a first refractory metal layer, with which the first trench is filled from the first height to a second height;
changing some of the first refractory metal layer into a refractory metal suicide layer by silicide reaction, and
forming an insulating film, with which the first trench is filled from the second height to the top of the first trench and which is formed of a material having a high etch selectivity with respect to the interlayer dielectric film when exposed to a predetermined etchant.

19. The method of claim 18, wherein the first refractory metal layer is one selected from the group consisting of Co, W, Ta, Mo, and Ti, the refractory metal suicide layer is one selected from the group consisting of $CoSi_x$, $TiSi_x$, $TaSi_x$, $MoSi_x$, $WSi_x$, and $PtSi_x$, the interlayer dielectric film is one selected from the group consisting of a silicon oxide film, a silicon nitride film, a PSG film, a BSG film, a BPSG film, a TEOS film, an ozone-TEOS film, a PE-TEOS film, a USG film, and a combination of the above films, and the insulating film is formed of a material different from the material that forms the interlayer dielectric film and is one selected from the group consisting of a silicon nitride film, an aluminum oxide film, and a tantalum oxide film.

20. The method of claim 7, wherein the step of forming the second gate stack further comprises the steps of:
forming a polysilicon layer, with which the first trench is filled to a first height;
forming a first refractory metal layer, with which the first trench is filled from the first height to a second height;
changing all of the first refractory metal layer into a refractory metal suicide layer by suicide reaction, and;
forming an insulating film, with which the first wench is filled from the second height to the top of the first trench and which is formed of a material having a high etch selectivity wit respect to the interlayer dielectric film when exposed to a predetermined etchant.

21. The method of claim 20, wherein the first refractory metal layer is one selected from the group consisting of Co, W, Ta, Mo, and Ti, the refractory metal silicide layer is one selected from the group consisting of $CoSi_x$, $TiSi_x$, $TaSi_x$, $MoSi_x$, $Wsi_x$, and $PtSi_x$, the interlayer dielectric film is one selected from the group consisting of a silicon oxide film, a silicon nitride film, a BSG film, a BPSG film, a TEOS film, an ozone-TEOS film, a PE-TEOS film, a USG film, and a combination of the above films, and the insulating film is formed of a material different from the material that forms the interlayer dielectric film and is one selected from the group consisting of a silicon nitride film, an aluminum oxide film, and a tantalum oxide film.

* * * * *

UNITED STATES PATENT AND TRADEMARK OFFICE
CERTIFICATE OF CORRECTION

PATENT NO.    : 6,583,004 B2
DATED         : June 24, 2003
INVENTOR(S)   : Kim

It is certified that error appears in the above-identified patent and that said Letters Patent is hereby corrected as shown below:

<u>Column 8,</u>
Line 35, "suicide layer pattern" should read -- silicide layer pattern --.

<u>Column 12,</u>
Line 5, "when exposed to a predetermined etchant" should read -- under a predetermined etchant --.
Lines 38 and 47, "suicide layer" should read -- silicide layer --.
Line 65, "suicide layer by suicide reaction" should read -- silicide layer by silicide reaction --.
Line 66, "first wench" should read -- first trench --.

<u>Column 13,</u>
Line 2, "wit respect" should read -- with respect --.

Signed and Sealed this

Fourth Day of November, 2003

JAMES E. ROGAN
*Director of the United States Patent and Trademark Office*